(12) United States Patent
Lin

(10) Patent No.: US 10,076,034 B2
(45) Date of Patent: Sep. 11, 2018

(54) ELECTRONIC STRUCTURE

(71) Applicant: NANYA TECHNOLOGY CORPORATION, Taoyuan (TW)

(72) Inventor: Po-Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 27 days.

(21) Appl. No.: 15/334,303

(22) Filed: Oct. 26, 2016

(65) Prior Publication Data

US 2018/0116053 A1  Apr. 26, 2018

(51) Int. Cl.

| H05K 1/11 | (2006.01) |
| H05K 1/14 | (2006.01) |
| H01L 23/00 | (2006.01) |
| H01L 25/065 | (2006.01) |
| H01L 25/00 | (2006.01) |

(52) U.S. Cl.
CPC ............. H05K 1/144 (2013.01); H01L 24/03 (2013.01); H01L 24/05 (2013.01); H01L 24/11 (2013.01); H01L 24/13 (2013.01); H01L 25/0657 (2013.01); H01L 25/50 (2013.01); H05K 1/111 (2013.01); *H01L 2224/03614* (2013.01); *H01L 2224/0401* (2013.01); *H01L 2224/1146* (2013.01); *H01L 2224/13026* (2013.01); *H01L 2224/13082* (2013.01); *H01L 2224/13111* (2013.01); *H01L 2224/13144* (2013.01); *H01L 2224/13147* (2013.01); *H01L 2225/06513* (2013.01); *H01L 2225/06558* (2013.01)

(58) Field of Classification Search
CPC . H01L 2924/00013; H01L 2924/00014; H01L 2224/05666; H01L 2224/11462; H01L 2224/11901; H01L 2224/13109; H01L 2224/13111; H01L 2224/13113; H01L 2224/13147; H01L 2224/13155; H01L 2924/01074

See application file for complete search history.

(56) References Cited

U.S. PATENT DOCUMENTS

| 7,884,487 B2 | 2/2011 | Yang et al. | |
| 2004/0262726 A1* | 12/2004 | Hua | H01L 24/81 257/678 |
| 2005/0062169 A1* | 3/2005 | Dubin | H01L 21/288 257/779 |
| 2009/0075469 A1* | 3/2009 | Furman | H01L 21/563 438/613 |
| 2009/0166888 A1* | 7/2009 | Pozder | H01L 24/11 257/777 |
| 2012/0181071 A1* | 7/2012 | Jadhav | H01L 24/11 174/257 |

FOREIGN PATENT DOCUMENTS

TW   201029136 A1   8/2010

\* cited by examiner

*Primary Examiner* — Yuriy Semenenko
(74) *Attorney, Agent, or Firm* — CKC & Partners Co., Ltd.

(57) ABSTRACT

An electronic structure is provided. The electronic structure includes a first board structure, a first contact pad, a first joint member, and a second joint member. The first contact pad is disposed on the first board structure. The first joint member is disposed on the first contact pad, in which the first joint member has a first Young's modulus. The second joint member is disposed on the first joint member, in which the second Young's modulus has a second Young's modulus, and the second Young's modulus is greater than the first Young's modulus.

18 Claims, 18 Drawing Sheets

ELECTRONIC STRUCTURE

BACKGROUND

Technical Field

The present disclosure relates to an electronic structure.

Description of Related Art

With the rapid growth of electronic industry, the R & D of electronic products is gradually directed to the pursuit of versatile and high performance. In order to achieve the requirements of high integration and miniaturization of semiconductor components, the requirements of the package structure also increase.

To further improve various characteristics of a package structure, persons in the industry all endeavor to search the solutions. How to provide a package structure with better characteristics is one of the important research topics, and is also a target that needs to be improved in the related fields.

SUMMARY

This disclosure provides an electronic structure to enhance the structure stability and the line density.

In one aspect of the disclosure, an electronic structure is provided. The electronic structure includes a first board structure, a first contact pad, a first joint member, and a second joint member. The first contact pad is disposed on the first board structure. The first joint member is disposed on the first contact pad, in which the first joint member has a first Young's modulus. The second joint member is disposed on the first joint member, in which the second joint member has a second Young's modulus, and the second Young's modulus is greater than the first Young's modulus.

In one or more embodiments, the first joint member is made of tin or gold.

In one or more embodiments, the second joint member is made of copper.

In one or more embodiments, the first board structure is a chip, an interposer, or a substrate structure.

In one or more embodiments, the first joint member has a first bottom surface and a first top surface opposite to the first bottom surface, the second joint member has a second bottom surface and a second top surface opposite to the second bottom surface, the first bottom surface is fixed to the first contact pad, and the first top surface is fixed to the second bottom surface.

In one or more embodiments, the first joint member has a first bottom surface and a first top surface opposite to first bottom surface, the second joint member has a second bottom surface and a second top surface opposite to the second bottom surface, and the first top surface is in direct contact with the second bottom surface.

In another aspect of the disclosure, a stacked structure is provided. The stacked structure includes the aforementioned electronic structure and a jointed electronic structure. The jointed electronic structure is disposed on the second joint member. The jointed electronic structure includes a third joint member, a second contact pad, and a second board structure. The third joint member is disposed on the second joint member, in which the third joint member has a third Young's modulus, and the second Young's modulus is greater than the third Young's modulus. The second contact pad is disposed on third joint member. The second board structure is disposed on the second contact pad.

In one or more embodiments, the third joint member is made of tin or gold.

In one or more embodiments, the second board structure is a chip, an interposer, or a substrate structure.

In one or more embodiments, the jointed electronic structure further includes a fourth joint member disposed between the third joint member and the second contact pad, the fourth joint member has a fourth Young's modulus, and the fourth Young's modulus is greater than the first Young's modulus.

In one or more embodiments, the fourth joint member is made of copper.

In one or more embodiments, the jointed electronic structure further includes a fifth joint member disposed between the fourth joint member and the second contact pad, the fifth joint member has a fifth Young's modulus, and the second Young's modulus is greater than the fifth Young's modulus.

In one or more embodiments, the fifth joint member is made of tin or gold.

In one or more embodiments, the electronic structure further includes a sixth joint member disposed on the second joint member. The sixth joint member has a sixth Young's modulus, and the second Young's modulus is greater than the sixth Young's modulus.

In one or more embodiments, the electronic structure further includes a seventh joint member disposed between the first contact pad and the first joint member. The seventh joint member has a seventh Young's modulus, and the seventh Young's modulus is greater than the first Young's modulus.

In another aspect of the disclosure, a stacked structure is provided. The stacked structure includes the aforementioned electronic structure and a jointed electronic structure. The jointed electronic structure is disposed on the second joint member. The jointed electronic structure includes an eighth joint member, a second contact pad, and a second board structure. The eighth joint member is disposed on the second joint member, in which the eighth joint member has an eighth Young's modulus, and the second Young's modulus is greater than the eighth Young's modulus. The second contact pad is disposed on the eighth joint member. The second board structure is disposed on the second contact pad.

In one or more embodiments, the jointed electronic structure further includes a ninth joint member disposed between the eighth joint member and the second contact pad, in which the ninth joint member has a ninth Young's modulus, and the ninth Young's modulus is greater than the first Young's modulus.

In another aspect of the disclosure, a stacked structure is provided. The stacked structure includes a first board structure, a second board structure, and a joint combination structure. The joint combination structure is sandwiched between the first board structure and the second board structure. The joint combination structure includes a tenth joint member with a tenth melting temperature, a eleventh joint member with a eleventh melting temperature, and a twelfth joint member with a twelfth melting temperature. The tenth joint member is sandwiched between the eleventh joint member and the twelfth joint member, the tenth melting temperature is greater than the eleventh melting temperature, and the tenth melting temperature is greater than the twelfth melting temperature.

In one or more embodiments, the first board structure is a chip, an interposer, or a substrate structure, and second board structure is a chip, an interposer, or a substrate structure.

In another aspect of the disclosure, an electronic structure is provided. The electronic structure includes a first board structure, a first contact pad, a first joint member, and a second joint member. The first contact pad is disposed on the first board structure. The first joint member is disposed on the first contact pad, in which the first joint member has a first melting temperature. The second joint member is disposed on the first joint member, in which the second joint member has a second melting temperature, and the second melting temperature is greater than the first melting temperature.

The coefficient of thermal expansion (CTE) of the jointed electronic structure is usually different from the CTE of the electronic structure. Since the jointed electronic structure is jointed to the electronic structure in a high-temperature environment (over 200° C.), shift or twist may happen between the electronic structure and the jointed electronic structure after the stacked structure leaves the high-temperature environment to a room-temperature environment (about 25° C.). Since the first Young's modulus and the third Young's modulus are less than the second Young's modulus, the first joint member and the third joint member have good ability to tolerate the shift and the twist, such that the stacked structure may not be damaged.

In addition, since the overall structure of the joint structure includes the first joint member, the second joint member, and the third joint member, the thickness of the first joint member and the thickness of the third joint member may not be too large. Since the first Young's modulus and the third Young's modulus are less than the second Young's modulus, the first joint member and the third joint member may protrude from the second joint member due to the deformations of the first joint member and the third joint member. However, since the thickness of the first joint member and the thickness of the third joint member are not too large, the deformation issue is not serious. Therefore, the overall width of the joint structure (the first joint member, the second joint member, and third the joint member) will not become too large due to deformation issue, so the joint structure will not occupy too much space, such that fine pitch configuration can be well applied to the electronic structure and the jointed electronic structure.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Figure 1:
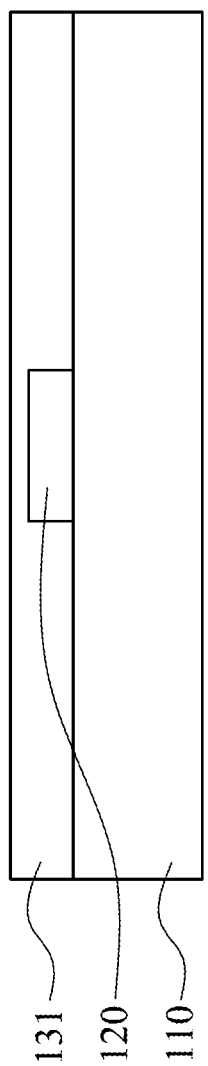
FIGS. 1 to 5 are schematic cross-sectional views of intermediate steps in processes for manufacturing an electronic structure according to one embodiment of this disclosure.

FIGS. 1 to 5 are schematic cross-sectional views of intermediate steps in processes for manufacturing an electronic structure 100 according to one embodiment of this disclosure. As shown in FIG. 1, a board structure 110 is provided. In some embodiments, the board structure 110 may be a chip, an interposer, or a substrate structure.

At least one contact pad 120 is formed on the board structure 110. Then, a passivation layer 131 is formed on the board structure 110 and the contact pad 120, such that the passivation layer 131 covers the contact pad 120.

Figure 2:
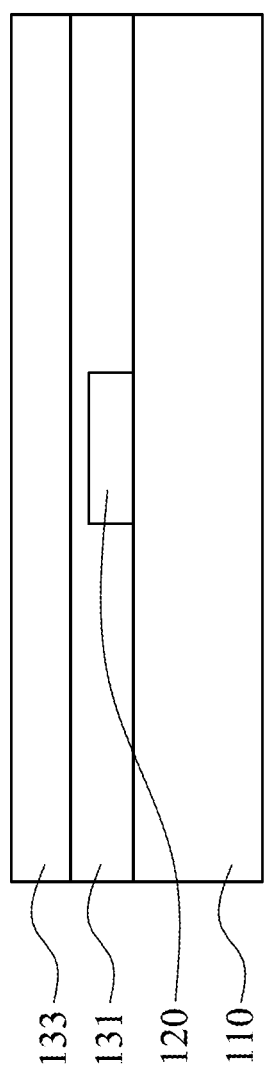

As shown in FIG. 2, a passivation layer 133 is formed on the passivation layer 131.

Figure 3:
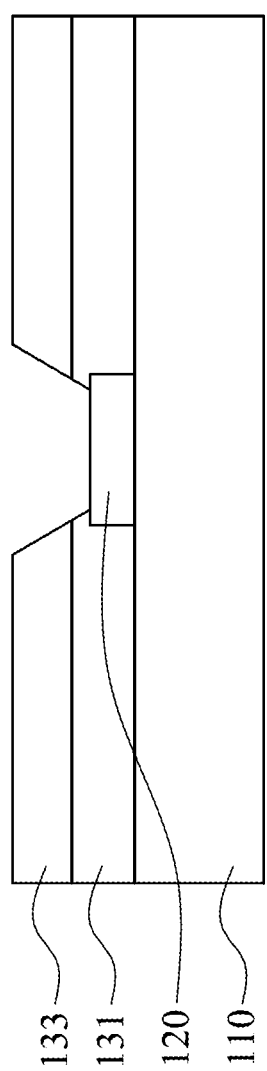

As shown in FIG. 3, the passivation layer 131 and the passivation layer 133 are patterned, such that the contact pad 120 is exposed by the passivation layer 131 and the passivation layer 133.

Figure 4:
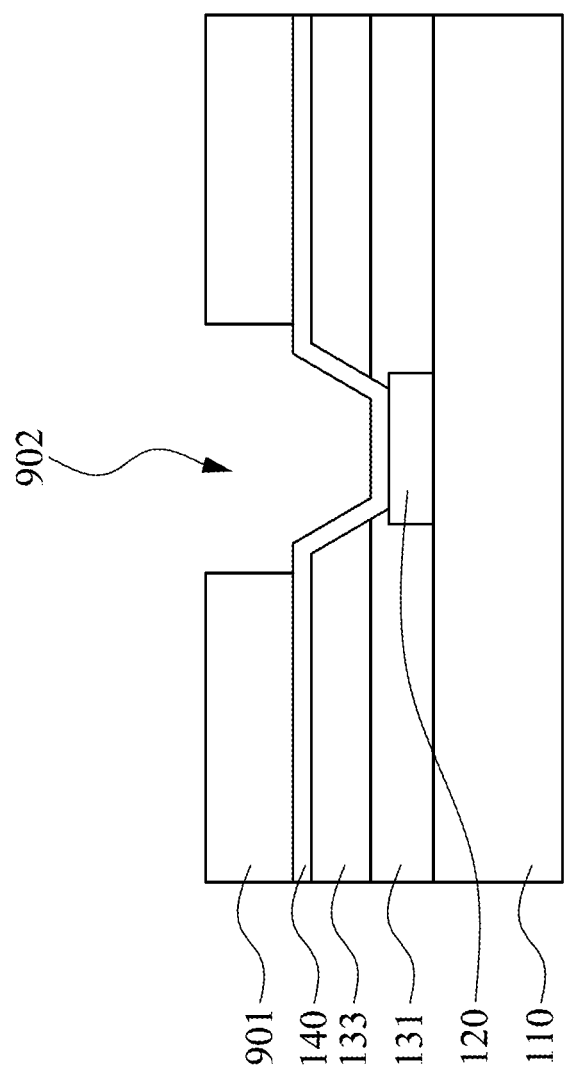

As shown in FIG. 4, an UBM (under Bump Metallization) layer 140 is conformally formed on the contact pad 120, the passivation layer 131, and the passivation layer 133.

Then, a photoresist 901 is formed on the UBM layer 140. The photoresist 901 may be a wet film or a dry film. Then, the photoresist 901 is patterned to form an opening 902 exposing a part of the UBM layer 140 disposed on the contact pad 120.

Figure 5:
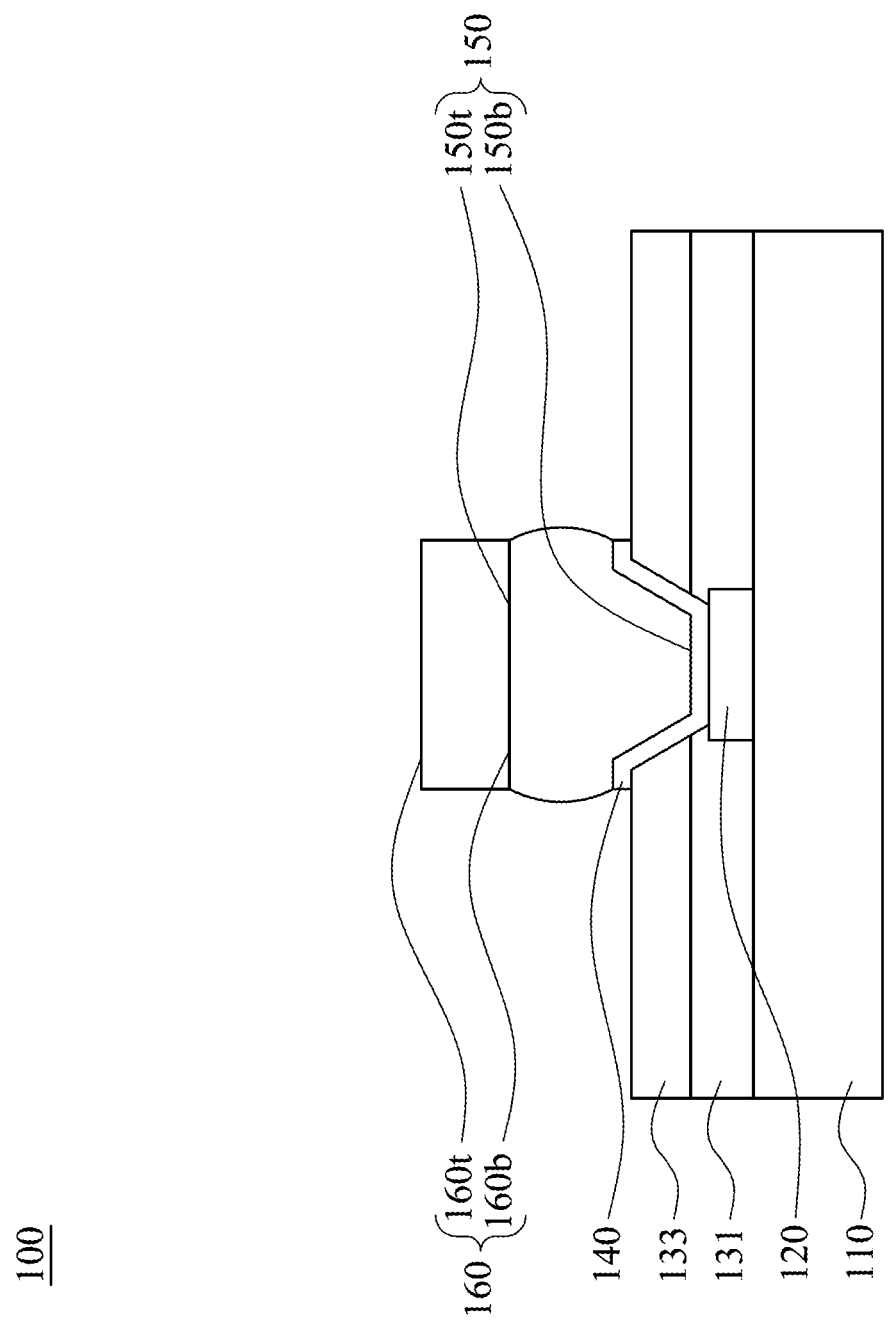

As shown in FIG. 4 and FIG. 5, a joint member 150 is formed in the opening 902. Then, a joint member 160 is formed in the opening 902. In some embodiments, the joint member 150 and joint member 160 may be formed by plating processes.

The photoresist 901 is then removed. Then, an etching process is performed to partially remove the UBM layer 140 while leaving a part of the UBM layer 140 disposed between the contact pad 120 and the joint member 150.

In another aspect of the disclosure, an electronic structure 100 is provided. The electronic structure 100 includes a board structure 110, a contact pad 120, a joint member 150, and a joint member 160. The contact pad 120 is disposed on the board structure 110. The joint member 150 is disposed on the contact pad 120, in which the joint member 150 has a first Young's modulus and a first melting temperature. The joint member 160 is disposed on the joint member 150, in which the joint member 160 has a second Young's modulus and a second melting temperature. The second Young's modulus is greater than the first Young's modulus, and the second melting temperature is greater than the first melting temperature.

In some embodiments, the board structure 110 may be a chip, an interposer, or a substrate structure. The board structure may include a dielectric layer (not shown in Figs.) and a plurality of metal connections (not shown in Figs.). The metal connections are disposed in the dielectric layer.

In some embodiments, the contact pad 120 is made of aluminum or copper. Embodiments of this disclosure are not limited thereto. The person having ordinary skill in the art can make proper modifications to the material of the contact pad 120 depending on the actual application.

In some embodiments, the joint member 150 is made of tin or gold, and the joint member 160 is made of copper. Embodiments of this disclosure are not limited thereto. The person having ordinary skill in the art can make proper modifications to the materials of the joint member 150 and the joint member 160 depending on the actual application.

The joint member 150 has a bottom surface 150*b* and a top surface 150*t* opposite to the bottom surface 150*b*, the joint member 160 has a bottom surface 160*b* and a top surface 160*t* opposite to the bottom surface 160*b*, the bottom surface 150*b* is fixed to the contact pad 120, and the top surface 150*t* is fixed to the bottom surface 160*b*.

In some embodiments, the electronic structure 100 further includes a UBM layer 140 disposed between the contact pad 120 and the joint member 150. The UBM layer 140 may include an adhesive layer (not shown in Figs.), a wetting layer (not shown in Figs.), or a barrier layer (not shown in Figs.). In some embodiments, the adhesive layer is disposed on the contact pad 120. The wetting layer is disposed on the adhesive layer. The oxidation barrier layer is disposed on the wetting layer.

The bottom surface 150*b* is in direct contact with the UBM layer 140, and the top surface 150*t* is in direct contact with the bottom surface 160*b*. Embodiments of this disclosure are not limited thereto. In some other embodiments, the electronic structure 100 may not include the UBM layer 140, and the bottom surface 150*b* is in direct contact with the contact pad 120.

In some embodiments, the electronic structure 100 further includes a passivation layer 131 and a passivation layer 133. The passivation layer 131 and the passivation layer 133 are disposed on the board structure 110. The contact pad 120 is disposed in the passivation layer 131.

The passivation layer 131 may be made of silicon dioxide or silicon nitride. Embodiments of this disclosure are not limited thereto. The person having ordinary skill in the art can make proper modifications to the material of the passivation layer 131 depending on the actual application.

The passivation layer 133 may be made of PI (polyimide). Embodiments of this disclosure are not limited thereto. The person having ordinary skill in the art can make proper modifications to the material of the passivation layer 133 depending on the actual application.

Figure 6:
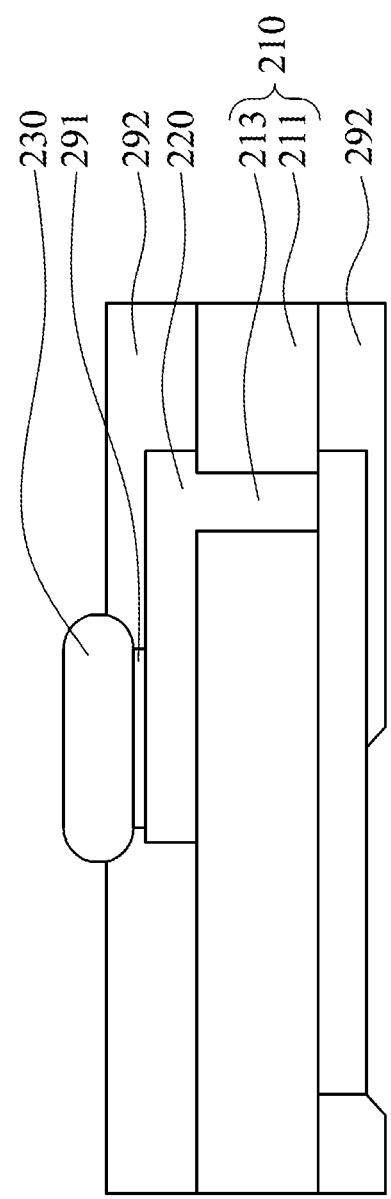
FIG. 6 is a schematic cross-sectional view of an electronic structure to be jointed according to one embodiment of this disclosure.
Figure 7:
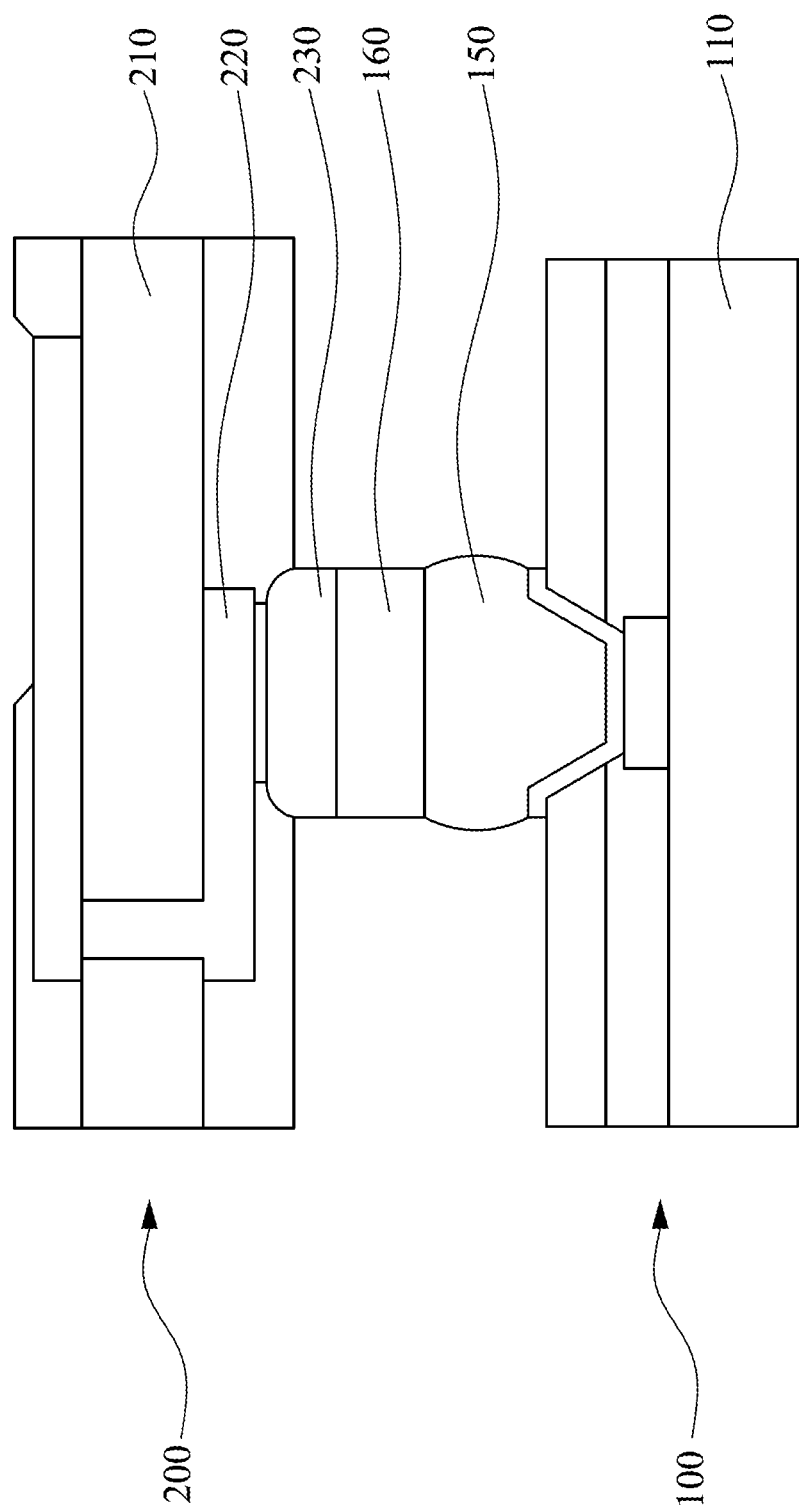
FIG. 7 is a schematic cross-sectional view of a stacked structure according to one embodiment of this disclosure.

FIG. 6 is a schematic cross-sectional view of an electronic structure 200 to be jointed according to one embodiment of this disclosure. FIG. 7 is a schematic cross-sectional view of a stacked structure 800 according to one embodiment of this disclosure. As shown in FIG. 5, FIG. 6, and FIG. 7, an electronic structure 200 is provided. The electronic structure 200 is to be jointed with the electronic structure 100 to form a stacked structure 800.

As shown in FIG. 6, the electronic structure 200 includes a board structure 210, a contact pad 220, and a joint member 230. The contact pad 220 is disposed on the board structure 210. The joint member 230 is disposed on the contact pad 220.

The board structure 210 is a substrate structure. The board structure 210 includes a dielectric layer 211 and at least one metal connection 213. The metal connections 213 are disposed in the dielectric layer 211.

Embodiments of this disclosure are not limited thereto. In some other embodiments, the board structure 210 may be a chip or an interposer.

The joint member 230 is made of tin or gold. Embodiments of this disclosure are not limited thereto. The person having ordinary skill in the art can make proper modifications to the material of the joint member 230 depending on the actual application.

The electronic structure 200 further includes a bonding layer 291 and two solder masks 292. The bonding layer 291 is disposed between the contact pad 220 and the joint member 230. The solder masks 292 are disposed on two sides of the board structure 210.

The bonding layer 291 may be made of gold or nickel. Embodiments of this disclosure are not limited thereto. The person having ordinary skill in the art can make proper modifications to the material of the bonding layer 240 depending on the actual application.

As shown in FIG. 7, the electronic structure 200 is turned upside down, and the electronic structure 200 is jointed to the electronic structure 100. Therefore, the electronic structure 200 is disposed on the joint member 160. The joint member 230 is disposed on the joint member 160, in which the joint member 230 has a third Young's modulus and a third melting temperature. The second Young's modulus is greater than the third Young's modulus, and the second melting temperature is greater than the third melting temperature. The contact pad 220 is disposed on joint member 230. The board structure 210 is disposed on the contact pad 220. The joint member 150, the joint member 160, and the joint member 230 form a joint combination structure 701.

Since the third melting temperature is less than the second melting temperature, the joint member 230 is easily to be melted and thus easily bonded to the joint member 160.

The coefficient of thermal expansion (CTE) of the electronic structure 200 is usually different from the CTE of the electronic structure 100. Since the electronic structure 200 is jointed to the electronic structure 100 in a high-temperature environment (over 200° C.), shift or twist may happen between the electronic structure 100 and the electronic structure 200 after the stacked structure 800 leaves the high-temperature environment to a room-temperature environment (about 25° C.). Since the first Young's modulus and the third Young's modulus are less than the second Young's modulus, the joint member 150 and the joint member 230 have good ability to tolerate the shift and the twist, such that the stacked structure 800 may not be damaged.

In addition, since the overall structure of the joint structure includes the joint member 150, the joint member 160, and the joint member 230, the thickness of the joint member 150 and the thickness of the joint member 230 may not be too large. Since the first Young's modulus and the third Young's modulus are less than the second Young's modulus, the joint member 150 and the joint member 230 may protrude from the joint member 160 due to the deformations of the joint member 150 and the joint member 230. However, since the thickness of the joint member 150 and the thickness of the joint member 230 are not too large, the deformation issue is not serious. Therefore, the overall width of the joint structure (the joint member 150, the joint member 160, and the joint member 230) will not become too large due to deformation issue, so the joint structure will not occupy too much space, such that fine pitch configuration can be well applied to the first electronic structure 100 and the second electronic structure 200.

Figure 8:
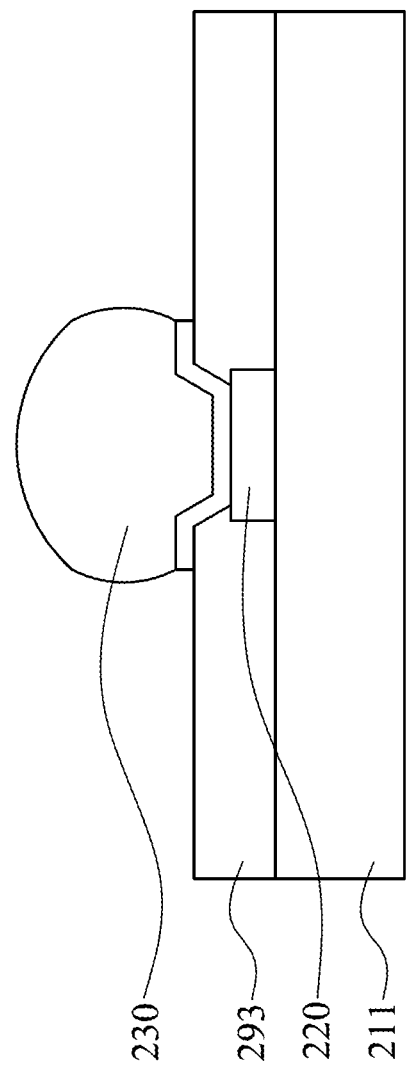
FIG. 8 is a schematic cross-sectional view of the electronic structure to be jointed according to another embodiment of this disclosure.
Figure 9:
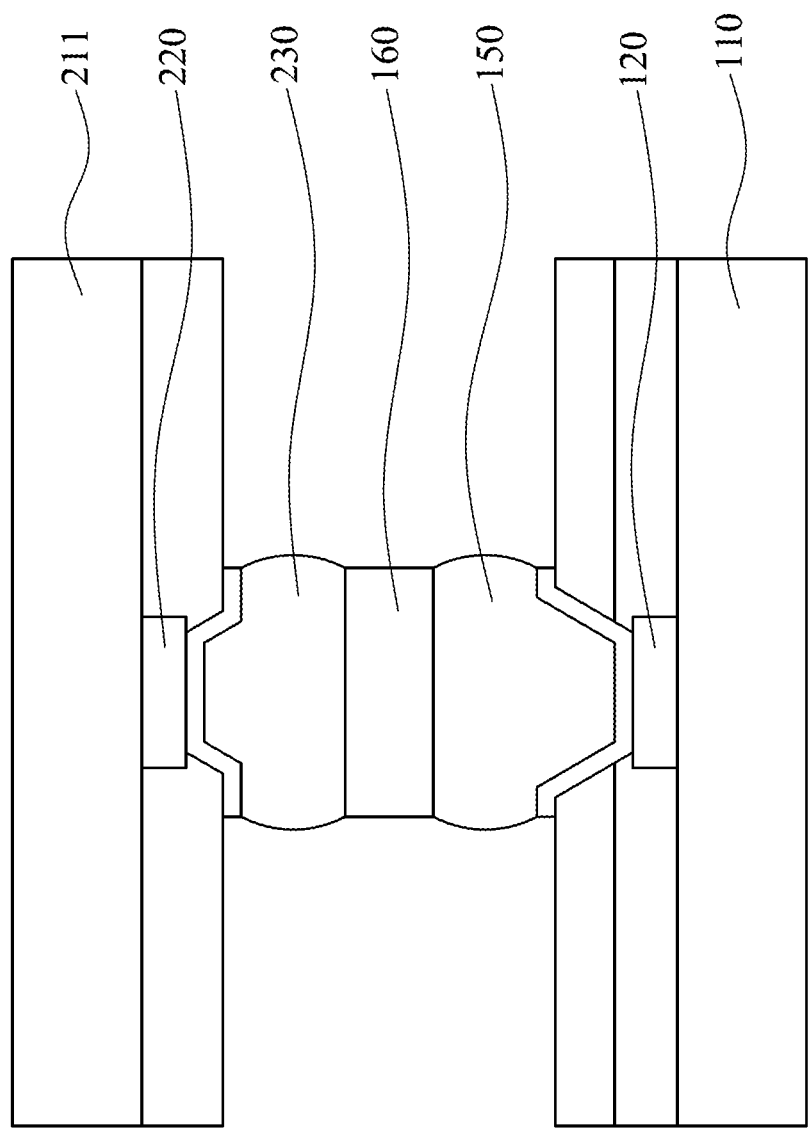
FIG. 9 is a schematic cross-sectional view of the stacked structure according to another embodiment of this disclosure.

FIG. 8 is a schematic cross-sectional view of the electronic structure 201 to be jointed according to another embodiment of this disclosure. FIG. 9 is a schematic cross-sectional view of the stacked structure 801 according to another embodiment of this disclosure. As shown in FIG. 8 and FIG. 9, the electronic structure 201 and the stacked structure 801 in this embodiment are similar to the electronic structure 200 and the stacked structure 800 in the aforementioned embodiment. The main difference between this embodiment and the aforementioned embodiment is that, in this embodiment, the board structure 211 is a chip. In addition, the electronic structure 201 further includes a passivation layer 293 disposed on the board structure 211.

Figure 10:
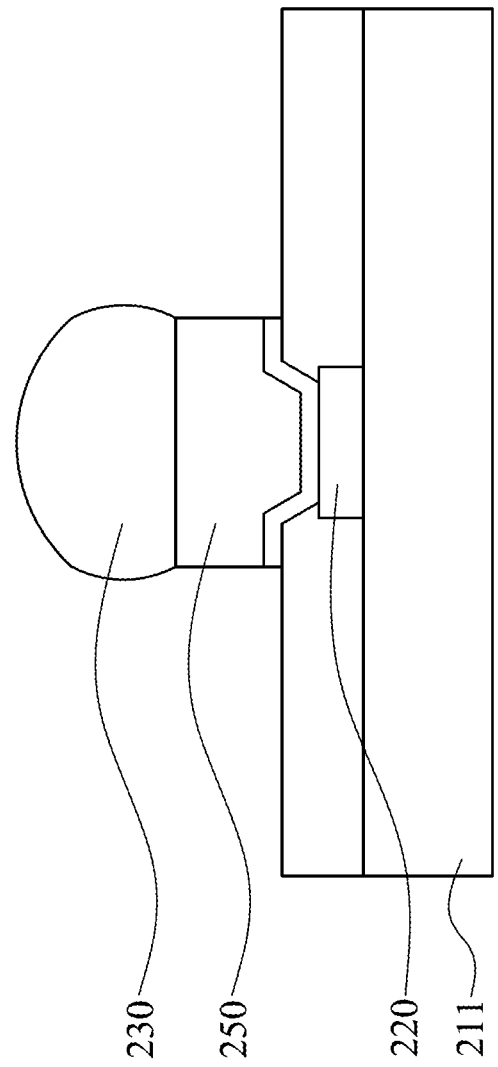
FIG. 10 is a schematic cross-sectional view of the electronic structure to be jointed according to another embodiment of this disclosure.
Figure 11:
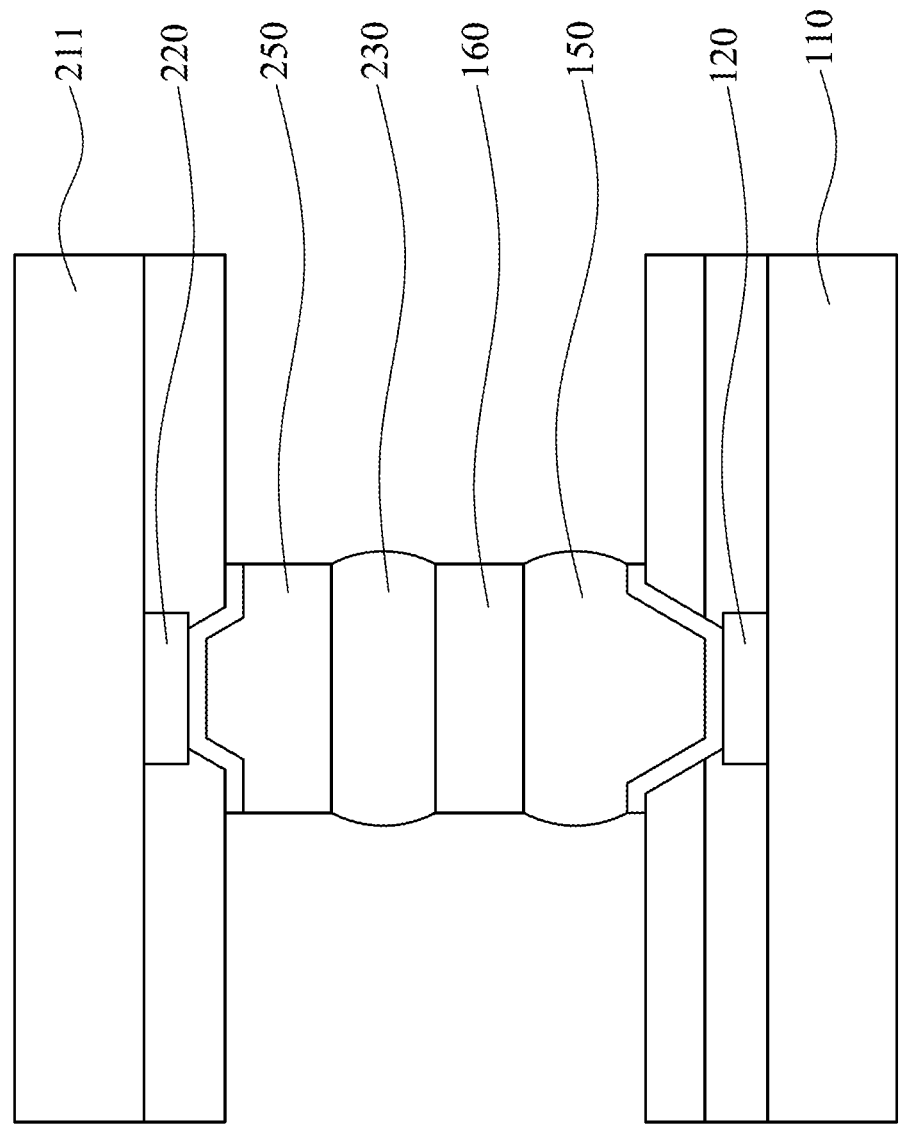
FIG. 11 is a schematic cross-sectional view of the stacked structure according to another embodiment of this disclosure.

FIG. 10 is a schematic cross-sectional view of the electronic structure 202 to be jointed according to another embodiment of this disclosure. FIG. 11 is a schematic cross-sectional view of the stacked structure 802 according to another embodiment of this disclosure. As shown in FIG. 10 and FIG. 11, the electronic structure 202 and the stacked structure 802 in this embodiment are similar to the electronic structure 201 and the stacked structure 801 of FIG. 8 and FIG. 9. The main difference between the two embodiments is that, in this embodiment, the electronic structure 202 further includes a joint member 250 disposed between the joint member 230 and the second contact pad 220, the joint member 250 has a fourth Young's modulus and a fourth melting temperature, and the fourth Young's modulus is greater than the first Young's modulus, and the fourth melting temperature is greater than the first melting temperature. The joint member 150, the joint member 160, the joint member 230, and the joint member 250 form a joint combination structure 702.

In some embodiments, the joint member 250 is made of copper. Embodiments of this disclosure are not limited thereto. The person having ordinary skill in the art can make proper modifications to the material of the joint member 250 depending on the actual application.

Figure 12:
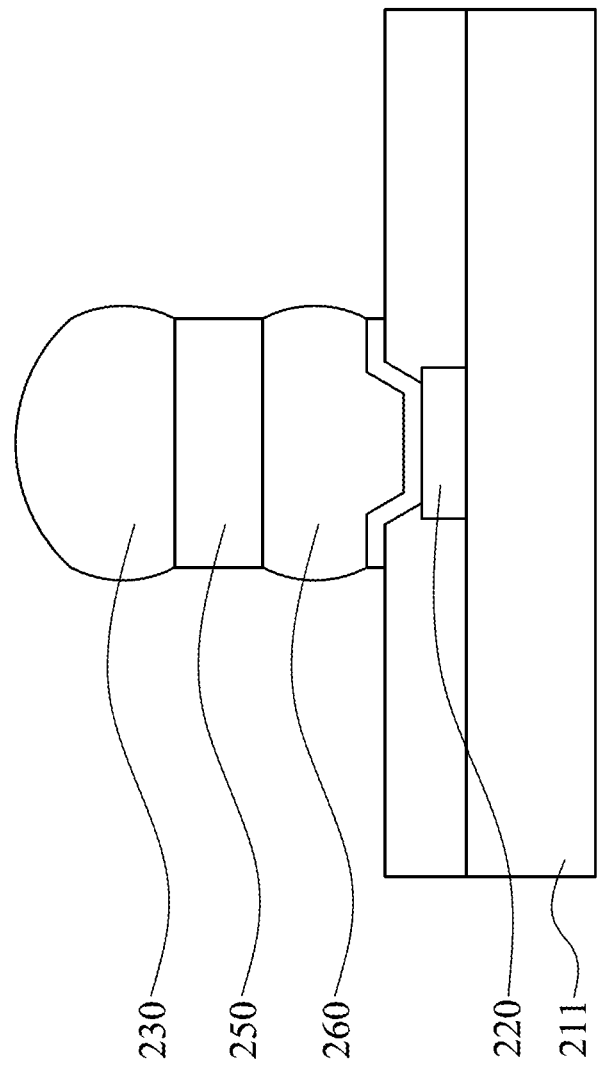
FIG. 12 is a schematic cross-sectional view of the electronic structure to be jointed according to another embodiment of this disclosure.
Figure 13:
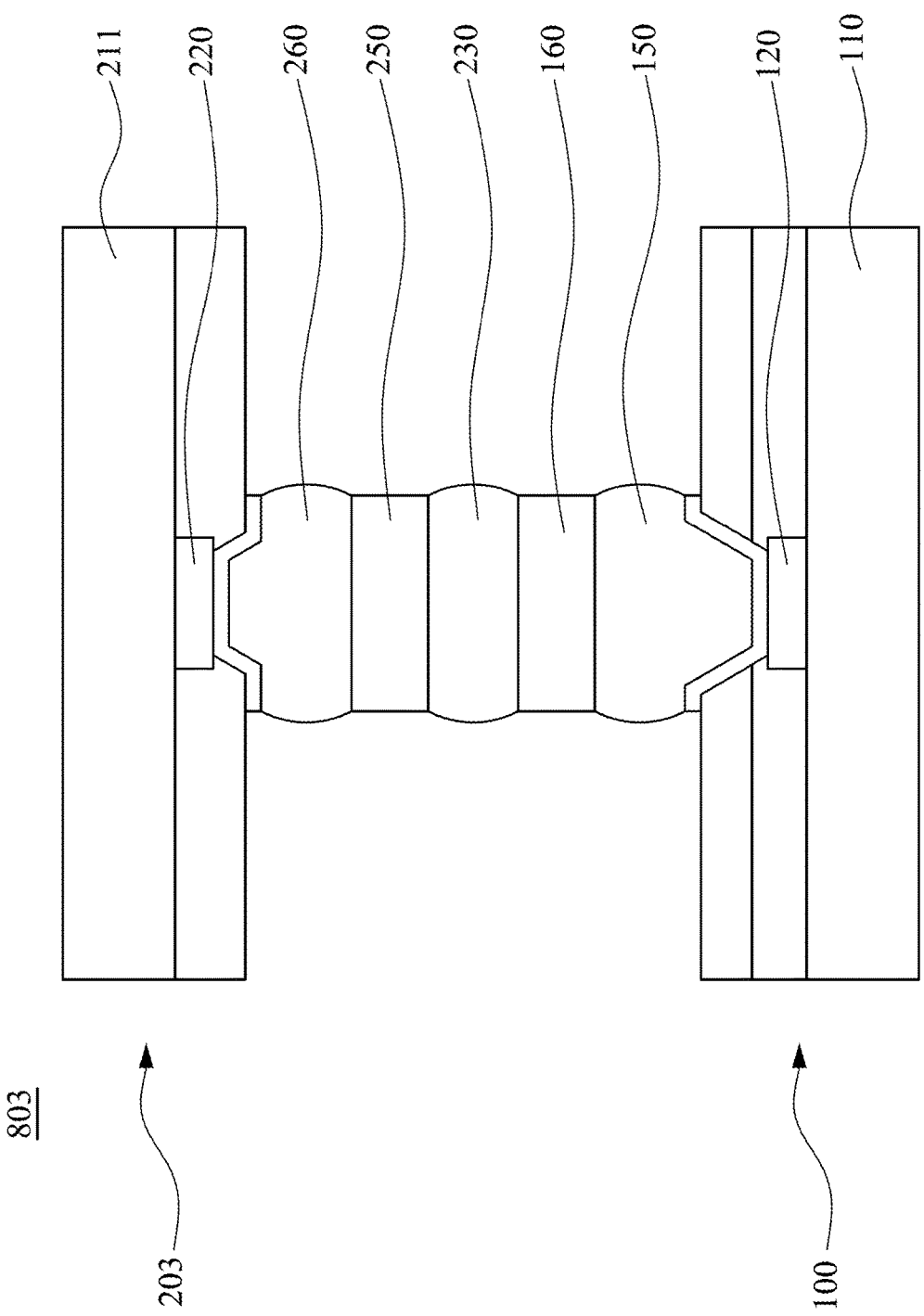
FIG. 13 is a schematic cross-sectional view of the stacked structure according to another embodiment of this disclosure.

FIG. 12 is a schematic cross-sectional view of the electronic structure 203 to be jointed according to another embodiment of this disclosure. FIG. 13 is a schematic cross-sectional view of the stacked structure 803 according to another embodiment of this disclosure. As shown in FIG. 12 and FIG. 13, the electronic structure 203 and the stacked structure 803 in this embodiment are similar to the electronic structure 202 and the stacked structure 802 of FIG. 10 and FIG. 11. The main difference between the two embodiments is that, in this embodiment, the electronic structure 203 further includes a joint member 260 disposed between the joint member 250 and the contact pad 220. The joint member 260 has a fifth Young's modulus and a fifth melting temperature. The second Young's modulus is greater than the fifth Young's modulus, and the second melting temperature is greater than the fifth melting temperature. The joint member 150, the joint member 160, the joint member 230, the joint member 250, and the joint member 260 form a joint combination structure 703.

In some embodiments, the joint member 260 is made of tin or gold. Embodiments of this disclosure are not limited thereto. The person having ordinary skill in the art can make proper modifications to the material of the joint member 260 depending on the actual application.

Figure 14:
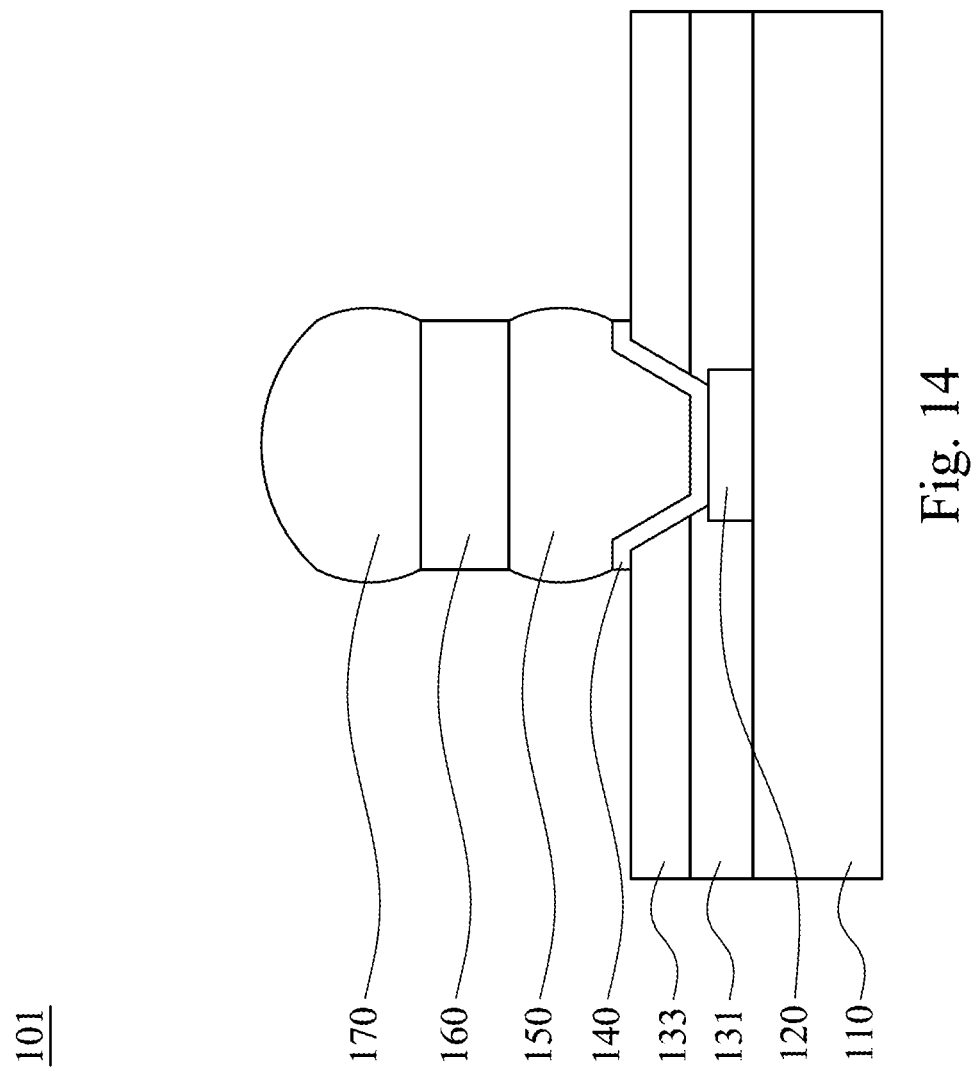
FIG. 14 is a schematic cross-sectional view of the electronic structure according to another embodiment of this disclosure.
Figure 15:
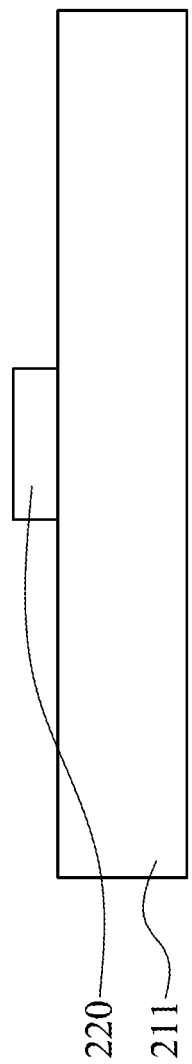
FIG. 15 is a schematic cross-sectional view of the electronic structure to be jointed according to another embodiment of this disclosure.
Figure 16:
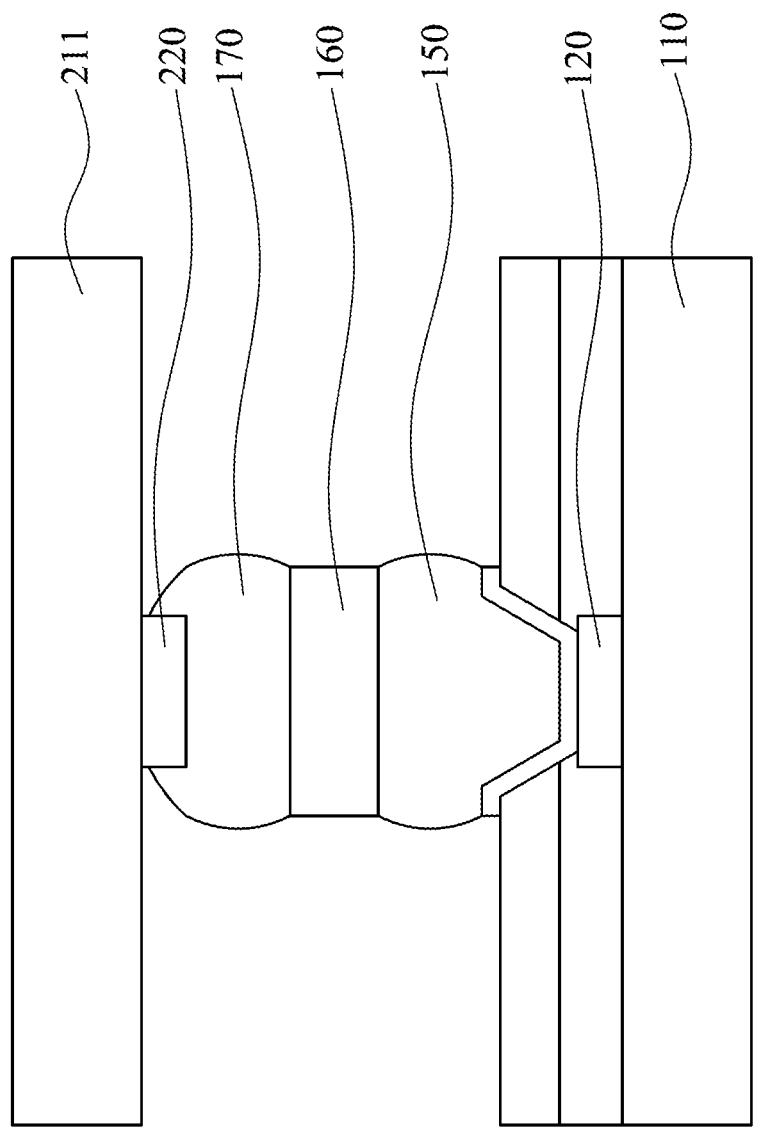
FIG. 16 is a schematic cross-sectional view of the stacked structure according to another embodiment of this disclosure.

FIG. 14 is a schematic cross-sectional view of the electronic structure 101 according to another embodiment of this disclosure. FIG. 15 is a schematic cross-sectional view of the electronic structure 204 to be jointed according to another embodiment of this disclosure. FIG. 16 is a schematic cross-sectional view of the stacked structure 803 according to another embodiment of this disclosure. The electronic structure 101, the electronic structure 204 and the stacked structure 804 in this embodiment are similar to the electronic structure 100 of FIG. 5, the electronic structure 201 of FIG. 8, and the stacked structure 801 of FIG. 9. The main difference between the embodiments is described below.

As shown in FIG. 14, the electronic structure 101 further includes a joint member 170 disposed on the joint member 160. The joint member 170 has a sixth Young's modulus and a sixth melting temperature. The second Young's modulus is greater than the sixth Young's modulus, and the second melting temperature is greater than the sixth melting temperature.

As shown in FIG. 15, the electronic structure 204 does not include the joint member 230 and the passivation layer 293.

Then, as shown in FIG. 16, the electronic structure 204 is disposed on the joint member 170. The contact pad 220 is disposed on the joint member 170. The joint member 150, the joint member 160, and the joint member 170 form a joint combination structure 704.

Figure 17:
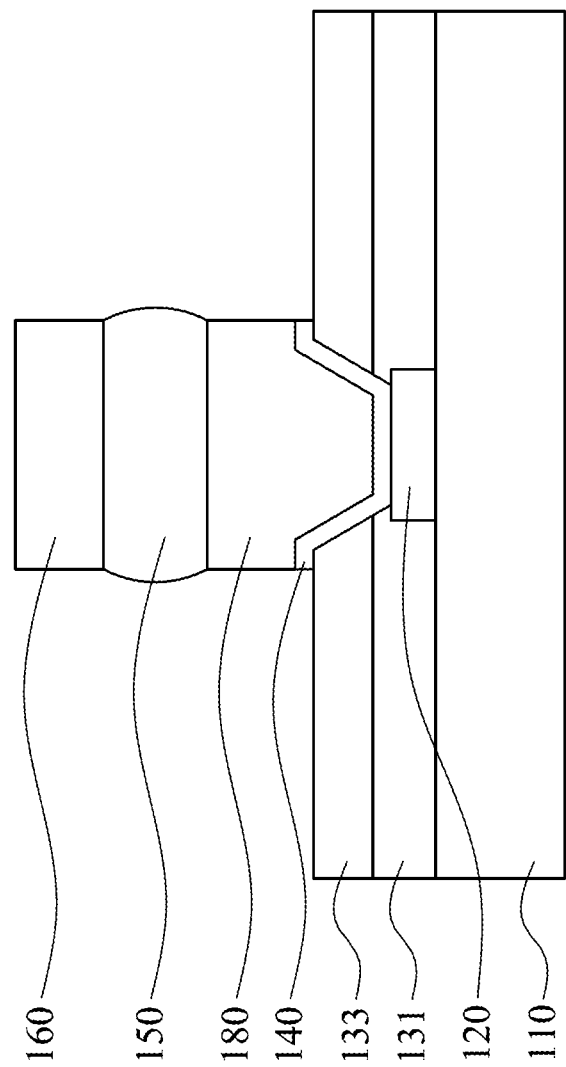
FIG. 17 is a schematic cross-sectional view of the electronic structure according to another embodiment of this disclosure.
Figure 18:
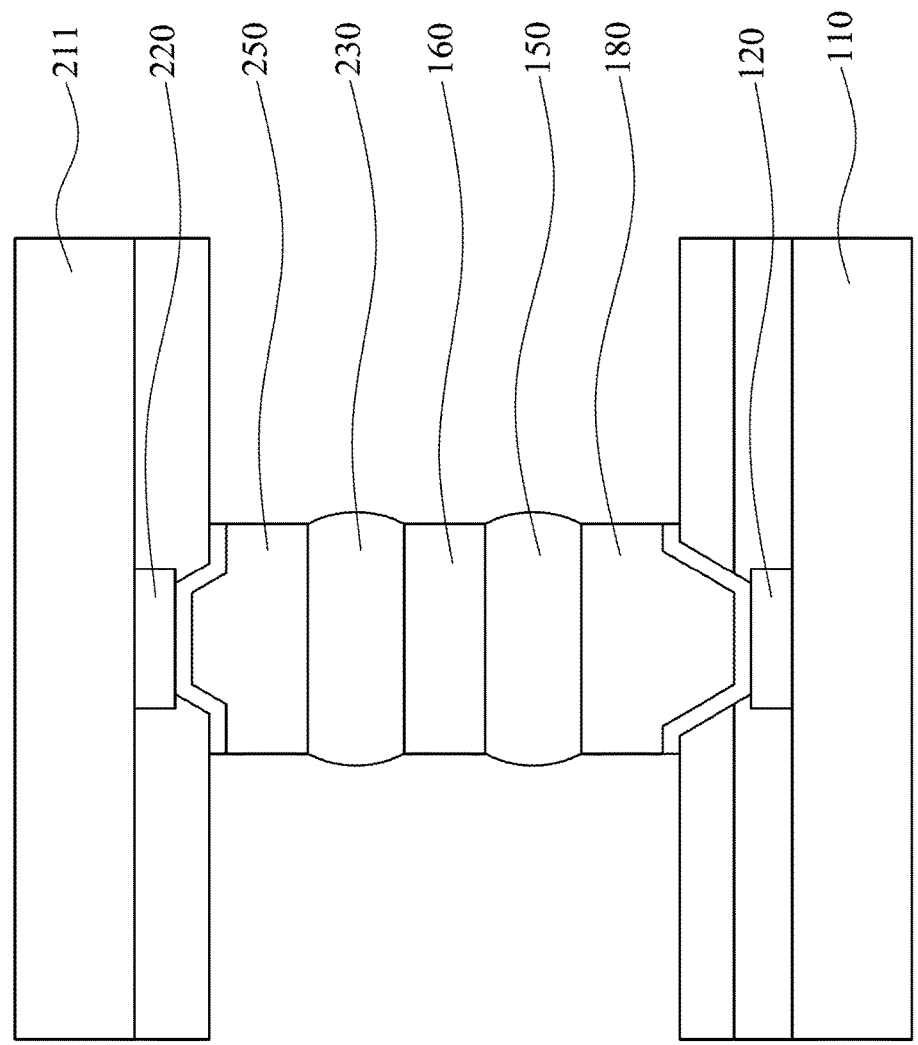
FIG. 18 is a schematic cross-sectional view of the stacked structure according to another embodiment of this disclosure.

FIG. 17 is a schematic cross-sectional view of the electronic structure 102 according to another embodiment of this disclosure. FIG. 18 is a schematic cross-sectional view of the stacked structure 805 according to another embodiment of this disclosure. The electronic structure 102 and the stacked structure 805 in this embodiment are similar to the electronic structure 100 of FIG. 5 and the stacked structure 802 of FIG. 11. The main difference between the embodiments is described below.

As shown in FIG. 17, the electronic structure 102 further includes a joint member 180 disposed between the contact pad 120 and the joint member 150. The joint member 180 has a seventh Young's modulus and a seventh melting temperature. The seventh Young's modulus is greater than the first Young's modulus, and the seventh melting temperature is greater than the first melting temperature.

In some embodiments, the joint member 180 is made of copper. Embodiments of this disclosure are not limited thereto. The person having ordinary skill in the art can make proper modifications to the material of the joint member 180 depending on the actual application.

As shown in FIG. 18, the electronic structure 102 is assembled with the electronic structure 202 of FIG. 10. Therefore, the electronic structure 202 is disposed on the joint member 160. The joint member 230 is disposed on the joint member 160. The joint 180, the joint member 150, the joint member 160, the joint member 230, and the joint member 250 form a joint combination structure 705.

The coefficient of thermal expansion (CTE) of the electronic structure 200 is usually different from the CTE of the electronic structure 100. Since the electronic structure 200 is jointed to the electronic structure 100 in a high-temperature environment (over 200° C.), shift or twist may happen between the electronic structure 100 and the electronic structure 200 after the stacked structure 800 leaves the high-temperature environment to a room-temperature environment (about 25° C.). Since the first Young's modulus and the third Young's modulus are less than the second Young's modulus, the joint member 150 and the joint member 230 have good ability to tolerate the shift and the twist, such that the stacked structure 800 may not be damaged.

In addition, since the overall structure of the joint structure includes the joint member 150, the joint member 160, and the joint member 230, the thickness of the joint member 150 and the thickness of the joint member 230 may not be too large. Since the first Young's modulus and the third Young's modulus are less than the second Young's modulus, the joint member 150 and the joint member 230 may protrude from the joint member 160 due to the deformations of the joint member 150 and the joint member 230. However, since the thickness of the joint member 150 and the thickness of the joint member 230 are not too large, the deformation issue is not serious. Therefore, the overall width of the joint structure (the joint member 150, the joint member 160, and the joint member 230) will not become too large due to deformation issue, so the joint structure will not occupy too much space, such that fine pitch configuration can be well applied to the first electronic structure 100 and the second electronic structure 200.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. An electronic structure, comprising:
   a first board structure;
   a first contact pad disposed on the first board structure;
   a first joint member disposed on the first contact pad, wherein the first joint member has a first Young's modulus;
   a second joint member disposed on the first joint member, wherein the second joint member has a second Young's modulus, and the second Young's modulus is greater than the first Young's modulus; and
   a third joint member in contact with the second joint member, wherein the third joint member has a third Young's modulus, and the second Young's modulus is greater than the third Young's modulus.

2. The electronic structure of claim 1, wherein the first joint member is made of tin or gold.

3. The electronic structure of claim 1, wherein the second joint member is made of copper.

4. The electronic structure of claim 1, wherein the first board structure is a chip, an interposer, or a substrate structure.

5. The electronic structure of claim 1, wherein the first joint member has a first bottom surface and a first top surface opposite to the first bottom surface, the second joint member has a second bottom surface and a second top surface opposite to the second bottom surface, the first bottom surface is fixed to the first contact pad, and the first top surface is fixed to the second bottom surface.

6. The electronic structure of claim 1, wherein the first joint member has a first bottom surface and a first top surface opposite to first bottom surface, the second joint member has a second bottom surface and a second top surface opposite to the second bottom surface, and the first top surface is in direct contact with the second bottom surface.

7. A stacked structure, comprising:
   the electronic structure of claim 1; and
   a jointed electronic structure disposed on the third joint member, the jointed electronic structure comprising:
      a second contact pad disposed on third joint member; and
      a second board structure disposed on the second contact pad.

8. The stacked structure of claim 1, wherein the third joint member is made of tin or gold.

9. The stacked structure of claim 7, wherein the second board structure is a chip, an interposer, or a substrate structure.

10. The stacked structure of claim 7, wherein the jointed electronic structure further comprises a fourth joint member disposed between the third joint member and the second contact pad, the fourth joint member has a fourth Young's modulus, and the fourth Young's modulus is greater than the first Young's modulus.

11. The stacked structure of claim 10, wherein the fourth joint member is made of copper.

12. The stacked structure of claim 10, wherein the jointed electronic structure further comprises a fifth joint member disposed between the fourth joint member and the second contact pad, the fifth joint member has a fifth Young's modulus, and the second Young's modulus is greater than the fifth Young's modulus.

13. The stacked structure of claim 12, wherein the fifth joint member is made of tin or gold.

14. The electronic structure of claim 1, further comprising:
   a sixth joint member disposed on the second joint member, wherein the sixth joint member has a sixth Young's modulus, and the second Young's modulus is greater than the sixth Young's modulus.

15. The electronic structure of claim 1, further comprising:
   a seventh joint member disposed between the first contact pad and the first joint member, wherein the seventh joint member has a seventh Young's modulus, and the seventh Young's modulus is greater than the first Young's modulus.

16. A stacked structure, comprising:
   the electronic structure of claim 15; and a jointed electronic structure disposed on the second joint member, the jointed electronic structure comprising:
an eighth joint member disposed on the second joint member, wherein the eighth joint member has an eighth Young's modulus, and the second Young's modulus is greater than the eighth Young's modulus;
a second contact pad disposed on the eighth joint member; and
a second board structure disposed on the second contact pad.

17. The stacked structure of claim 16, wherein the jointed electronic structure further comprises a ninth joint member disposed between the eighth joint member and the second contact pad, wherein the ninth joint member has a ninth Young's modulus, and the ninth Young's modulus is greater than the first Young's modulus.

18. An electronic structure, comprising:
a first board structure;
a first contact pad disposed on the first board structure;
a first joint member disposed on the first contact pad, wherein the first joint member has a first melting temperature;
a second joint member disposed on the first joint member, wherein the second joint member has a second melting temperature, and the second melting temperature is greater than the first melting temperature; and
a third joint member in contact with the second joint member, wherein the third joint member has a third melting temperature, and the second melting temperature is greater than the third melting temperature.

* * * * *